United States Patent [19]

Sugiyama et al.

[11] Patent Number: 4,745,169
[45] Date of Patent: May 17, 1988

[54] ALKALI-SOLUBLE SILOXANE POLYMER, SILMETHYLENE POLYMER, AND POLYORGANOSILSESQUIOXANE POLYMER

[75] Inventors: Hisashi Sugiyama, Yokohama; Kazuo Nate, Machida; Takashi Inoue; Akiko Mizushima, both of Yokohama, all of Japan

[73] Assignee: Hitachi, Ltd., Tokyo, Japan

[21] Appl. No.: 859,370

[22] Filed: May 5, 1986

[30] Foreign Application Priority Data

May 10, 1985 [JP] Japan ............................ 60-98032
Aug. 22, 1985 [JP] Japan ........................... 60-182950
Oct. 24, 1985 [JP] Japan ........................... 60-236344

[51] Int. Cl.$^4$ ............................................ C08G 77/00
[52] U.S. Cl. ......................................... 528/43; 528/14; 528/37; 528/21; 528/23; 528/25; 556/431; 556/449; 556/450

[58] Field of Search ................... 528/43, 25, 21, 23, 528/14, 37; 556/449, 450, 431

[56] References Cited

U.S. PATENT DOCUMENTS 3,328,450  6/1967  Plueddemann .................. 556/449
3,837,897  9/1974  Marzocchi ........................ 528/10
4,626,556 12/1986  Nozue et al. .................... 528/43

OTHER PUBLICATIONS

Hackh's Chemical Dictionary, 4th Ed., 1972, p. 87.

Primary Examiner—Melvin I. Marquis
Attorney, Agent, or Firm—Antonelli, Terry & Wands

[57] ABSTRACT

There are provided an alkali-soluble siloxane polymer, an alkali-soluble silmethylene polymer, and an alkali-soluble polyorganosilsesquioxane polymer. They are useful as a photoresist for the fabrication of semiconductor devices. They are suitable for dry etching because of their superior resistance to oxygen plasmas.

7 Claims, No Drawings

ALKALI-SOLUBLE SILOXANE POLYMER, SILMETHYLENE POLYMER, AND POLYORGANOSILSESQUIOXANE POLYMER

BACKGROUND OF THE INVENTION

The present invention relates to a new polymer which is extremely useful as a functional polymeric material such as light-sensitive and radiation-sensitive materials. More particularly, it relates to an alkali-soluble siloxane polymer in which more than 40% of the siloxane skeleton is composed of the unit represented by the formula (1); an alkali-soluble silmethylene polymer composed of the constitutional unit represented by the formula (2); and an alkali-soluble polyorganosilsesquioxane polymer represented by the formula (3).

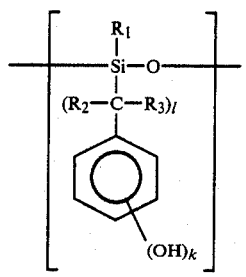
(1)

(where $R_1$ is hydrogen or a monovalent organic group other than aromatic groups; $R_2$ and $R_3$ are each hydrogen, chlorine, or a monovalent organic group; $l$ is an integer of 1 to 6; and $k$ is 1 or 2.)

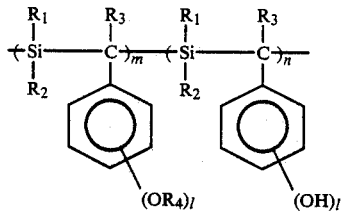
(2)

(where $R_1$, $R_2$, and $R_3$ are each a monovalent organic group; $R_4$ is an alkyl group; $l$ is 1 or 2; the OH groups and $OR_4$ groups are at arbitrary positions on the benzene ring, m and n are positive integers and $m+n$ is 2 to 200 and $n/(m+n)$ is greater than 0.4.)

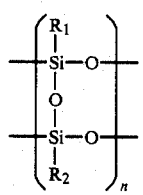
(3)

(where $R_1$ and $R_2$ are the same or different organic groups; and n is a degree of polymerization.)

Electronic parts such as semiconductor devices and integrated circuits are produced by means of microetching with light or radiation. Etching requires a resist, and the resist of alkali-development type is predominant because of its high resolution. It contains as a basic polymer an alkali-soluble polymer such as phenolic resin and polyvinyl phenol. For example, a composition of phenol novolak resin and o-quinonediazide forms a positive photoresist, and a composition of polyvinyl phenol and bisazide forms a negative photoresist.

After patterning of the resist layer, the exposed substrate undergoes etching. In view of the trend to ever smaller circuit patterns of semiconductor devices, wet etching is being replaced by dry etching. Thus, a resist material is required to withstand dry etching. In the case where the substrate is an organic material, etching is carried out by an oxygen plasma. The conventional resist material is poor in resistance to oxygen plasmas, and there is a demand for the improvement in this regard.

In the meantime, the resist of alkali-development type is described in "Kodak Microelectronics Seminor Proceedings, 116 (1976), by J. C. Strieter.

SUMMARY OF THE INVENTION

It is an object of the present invention to provide an alkali-soluble siloxane polymer which is superior in resistance to oxygen plasmas.

The present inventors synthesized a variety of polymers in which the main chain is a siloxane skeleton and the side chain has phenolic hydroxyl groups. As the result, it was found that the above-mentioned object is achieved by a siloxane polymer which contains more than 40% of the unit represented by the following formula (1) in the siloxane skeleton.

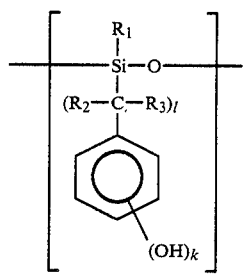
(1)

(where $R_1$ is hydrogen or a monovalent organic group other than aromatic groups (e.g., alkyl groups having 1 to 5 carbon atoms, vinyl group, and substitution product thereof, preferably $-CH_3$, $-C_2H_5$, and $-C_3H_7$); $R_2$ and $R_3$ are each hydrogen, chlorine, or a monovalent organic group (e.g., alkyl groups having 1 to 5 carbon atoms, vinyl group, aromatic groups such as phenyl and tolyl, and substitution product thereof), with hydrogen being preferable; $l$ is an integer of 1 to 6; and $k$ is 1 or 2. The OH group should preferably be at the p-position of the benzene ring.

What is important in the present invention is that the aromatic group is not directly connected to silicon in order to avoid the cleavage of the bond between the silicon atom and the aromatic group by the phenolic hydroxyl group. Thus, the siloxane other than that specified by the above formula (1) is not specifically limited unless an aromatic group is directly connected to the silicon atom. The siloxane polymer of this invention will be poor in alkali solubility unless the siloxane skeleton contains more than 40% of the unit represented by the above formula (1).

The present inventors also synthesized a variety of polymers in which the main chain is a silmethylene skeleton and the side chain has a phenolic hydroxyl group. As the result, it was found that the above-mentioned object of the invention is achieved by a polymer which is composed of the building blocks represented by the following formula (2).

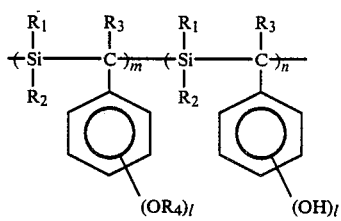

(where $R_1$, $R_2$, and $R_3$ are each a hydrogen or a monovalent organic group (e.g., alkyl group, vinyl group, aromatic group, and substitution product thereof, with $C_1$-$C_6$ alkyl groups being preferable for $R_1$ and $R_2$); $R_4$ is an alkyl group, preferably $C_1$-$C_6$ alkyl group; l is 1 or 2; the OH groups and $OR_4$ groups are at arbitrary positions on the benzene ring, m and n are positive integers and m+n is 2 to 200 and n/(m+n) is greater than 0.4.)

The present inventors also synthesized a variety of polymers in which the main chain is polysilsesquioxane having a structure very close to that of silicon oxide, and the side chain has a phenolic hydroxide. As the result, it was found that the above-mentioned object is achieved by a polyorganosilsesquinoxane represented by the following formula (3).

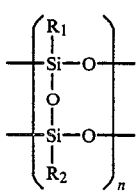

(where $R_1$ and $R_2$ are the same or different organic groups; and n is a degree of polymerization.) The polyorganosilsesquioxane may contain more than 40% of $R_1$ and $R_2$ each having phenolic hydroxyl groups. The value of n is 8 to 200. Examples of $R_1$ and $R_2$ are $C_1$-$C_6$ alkyl groups having phenol or cresol as a substituent group, as shown below.

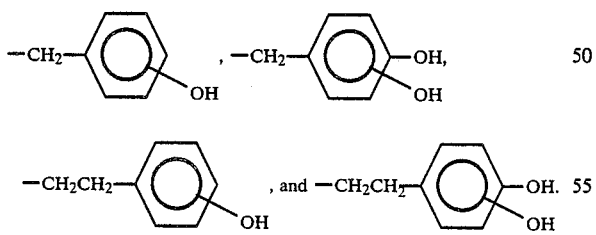

Side chains other than those shown above may be ones in which the phenolic hydroxyl groups are substituted by alkoxy groups, t-butyldimethylsiloxy groups, or methylene acetal. This polymer is not sufficiently alkali soluble unless the organic groups having phenolic hydroxyl groups account for more than 40% in the side chains.

The polymer of this invention as represented by the formula (1) is synthesized according to the following equations (4) to (7).

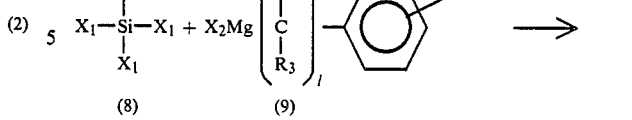

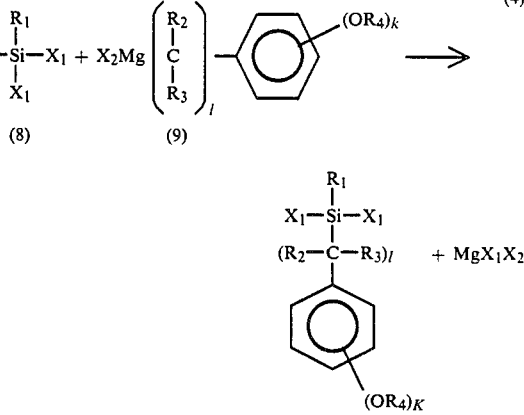

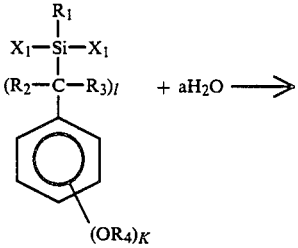

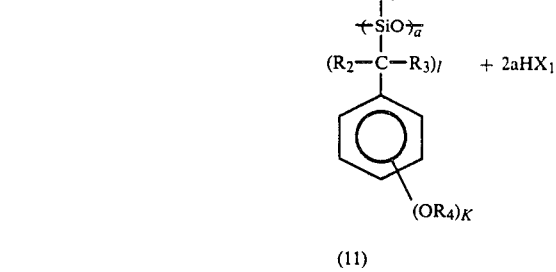

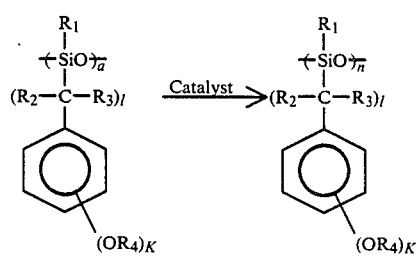

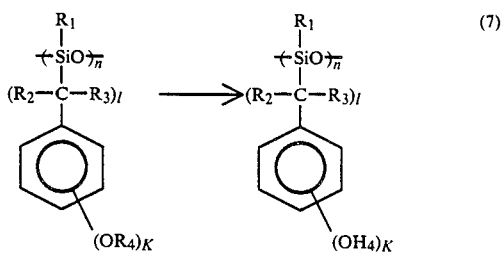

(where $X_1$ is a halogen (e.g., —Cl and —Br) or alkoxy group (e.g., —OMe and —OEt); $X_2$ is a halogen (e.g., —Cl and —Br) or alkyl group (e.g., $C_1$-$C_5$ alkyl group); a is 3 to 5; and n is an integer of 3 to 1000.)

At first, a trihalogenosilane or trialkoxysilane (8) is reacted with a Grignard reagent (9) to give a dihalogenosilane or dialkoxysilane (10), according to the equation (4). Then, the dialkoxysilane (10) is hydrolyzed to give a low-molecular weight cyclic siloxane (11), according to the equation (5). The low-molecular weight cyclic siloxane (11) undergoes ring opening polymerization by the aid of a catalyst, according to the equation (6). The suitable catalyst is $Me_4NOH$, $Bu_4POH$, metal hydroxide, or alkali metal-graphite interlaminar compound. The low-molecular weight cyclic siloxane (11) may be copolymerized with another kind of low-molecular weight cyclic siloxane. Finally, the $OR_4$ group is substituted by the OH group, according to the equation (7). The cleavage of the protective group may be accomplished by using MeSiI/MeOH and other reactions. Alternatively, the OH group may be protected from beginning by a silyl group such as t-butyldimethylsily group having a great steric hindrance and it is removed by the aid of an acid in the last stage.

The polymer (2) of this invention is usually synthesized according to the following equations (14)–(17).

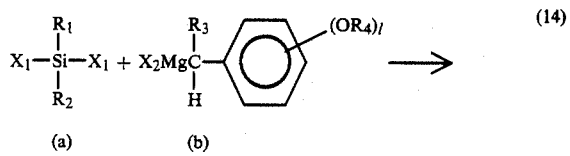

(a)        (b)

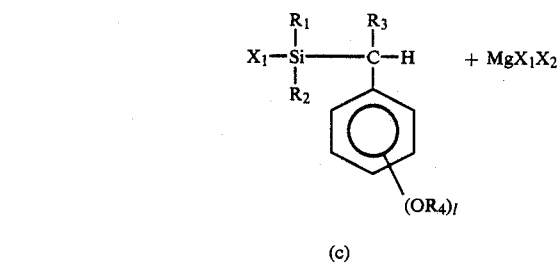

(c)

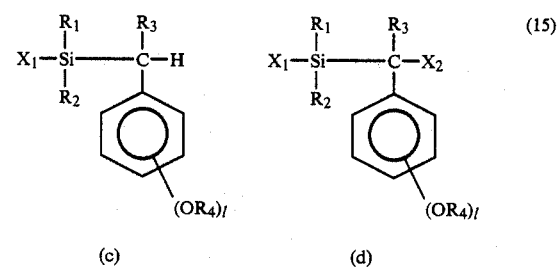

(c)        (d)

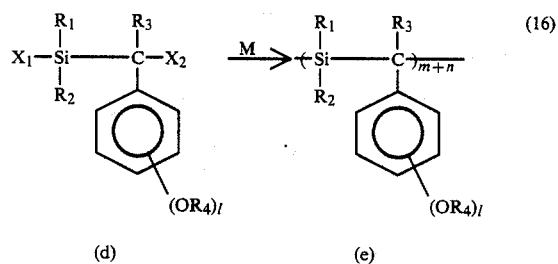

(d)        (e)

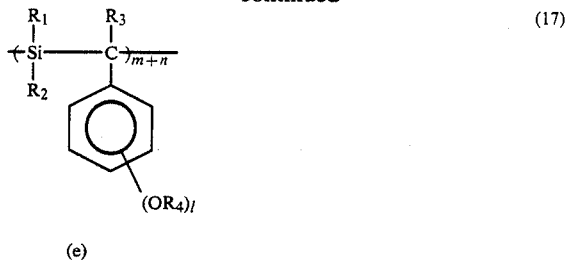

(e)

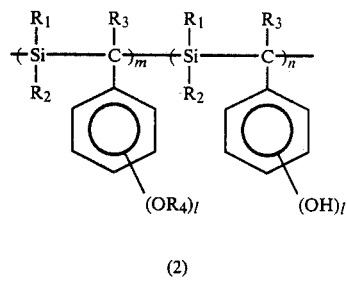

(2)

(where $X_1$ is a halogen or alkoxy group; $X_2$ is a halogen; and M denotes a metal.)

At first, a dihalogenosilane or dialkoxysilane (a) is reacted with a Grignard reagent (b) to give a monohalogenosilane or monoalkoxysilane (c), according to the equation (14). Then, the benzyl hydrogen in the compound (c) is halogenized to give the compound (d), according to the equation (15). This reaction may be accomplished by the aid of photochlorination, N-chlorosuccinimide, or N-bromosuccinimide. The compound (d) is polymerized into the compound (e) by the aid of a metal, according to the equation (16). The suitable metal is magnesium or an alkali metal. Where magnesium is used, Si and C in the polymer skeleton are arranged alternately; and where an alkali metal is used, the polymer skeleton contains the Si-Si linkage and the C-C linkage. Therefore, the polymer skeleton should be understood to contain both the Si-Si linkage and C-C linkage. Finally, the conversion of the $OR_4$ group is performed according to the equation (17). The cleavage of the protective group may be accomplished by using MeSiI/MeOH and other reactions. Alternatively, the OH group may be protected from beginning by a silyl group such as t-butyldimethylsilyl group having a great steric hindrance and it is removed by the aid of an acid in the last stage.

The polymer (3) of this invention is produced in two steps. In the first step, a polyorganosilsesquioxane, with the hydroxyl group protected, is synthesized from a corresponding trichlorosilane or trialkoxysilane. In the second step, the protective group is removed. The trichlorosilane or trialkoxysilane may be produced in many ways. Examples include the Grignard reaction, the condensation of a halide (such as benzyl chloride derivative) and $HSiCl_3$ by the aid of a tertiary amine and copper salt, and the addition of $HSiCl_3$ to a styrene derivative by the aid of a platinum catalyst.

The polyorganosilsesquioxane with the hydroxyl group protected was synthesized according to the processes, with or without modification, disclosed in J. Am. Chem. Soc., 82, 6194 (1960), J. Am. Chem. Soc., 87, 4317 (1965), Japanese Patent Publication No. 15989/1965, and Japanese Patent Laid-open Nos. 88099/1978 and 66422/1984. The resulting polymers had a degree of polymerization (n) in the range of 8 to 200 regardless of the process. Therefore, the process for synthesis is not specifically limited in this invention. On the other hand, there are various methods for removing the protective group. For example, trimethylsilyl iodide is used for an alkoxy group; tetra-n-butylammonium fluoride is used for a t-butyldimethylsiloxy group; and phosphorus pentachloride is used for methylene acetal. All of these methods can be applied to the synthesis of the polymer of this invention. Therefore, there are no limits in the methods of removing the protective group in the synthesis of the polymer of this invention.

The polymer of this invention is soluble in alkaline water such as aqueous solutions of tetramethylammonium hydroxide and potassium hydroxide; and it is also readily soluble in widely used organic solvents such as alcohols, ethers, amides, ketones, esters, and cellosolves. Thus, the polymer can be made into film by the aid of one of these solvents.

The polymer of this invention can be used as a base material of photoresists for light or radiation, if it is incorporated with a photosensitive or radiation-sensitive dissolution inhibitor suitable for the light or radiation to be used. The thus produced photoresist can be developed with an alkali.

In addition, as in the case of conventional resist of alkali development type, the polymer of this invention can be used as a positive photoresist if it is combined with o-quinonediazide, and it can also be used as a negative photoresist if it is combined with bisazide. The polymer of this invention as such can be used as a negative electron resist. On the other hand, when combined with poly(olefinsulfone), it can be used as a positive electron resist.

The film formed from the polymer of this invention does not waste at all in an oxygen plasma, keeping an extremely high resistance to dry etching. Therefore, it can be used as the top layer resist where the double-layer resist method is employed.

DESCRIPTION OF THE PREFERRED EMBODIMENTS

The invention is now described in more detail with reference to the following examples.

EXAMPLE 1

Poly(methyl-p-methoxybenzylsiloxane-co-methyl-p-hydroxybenzylsiloxane)

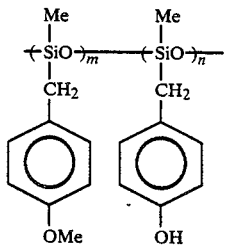

(a) Synthesis of methyldichloro-p-methoxybenzylsilane

In a 1-liter three-neck flask equipped with a stirrer, reflux condenser, dropping funnel, and thermometer were placed 23.3 g (1.00 mol) of magnesium powder, 82.6 g (0.640 mol) of methyltrichlorosilane, and 200 ml of diethyl ether. The magnesium was activated with iodine and dibromoethane. The flask was cooled to 10° C. to 0° C. A mixture of 50.0 g (0.319 mol) of p-methoxybenzyl chloride and 300 ml of diethyl ether was added dropwise with stirring from the dropping funnel over 4 hours at 10° C. to 0° C. After aging at room temperature for 1 hour, excess magnesium and magnesium chloride were removed by suction filtration. The filtrate was distilled to give 48.8 g (0.208 mol) of the desired product in a yield of 65%.

The properties of the desired product were as follows:

Boiling point: 86°–88° C./2 mmHg

NMR: (60 MHz, CCl$_4$, CH$_2$Cl$_2$, δ 5.33) δ 0.79 (3H, s), δ 2.68 (2H, s), δ 3.84 (3H, s), δ 6.80 (2H, d, J=9 Hz), δ 7.18 (2H, d, J=9 Hz).

IR ($\nu$ cm$^{-1}$) 1620, 1520, 1480, 1310, 1260, 1190, 1100, 1050, 850, 810, 755.

(b) Synthesis of trimer of methyl-p-methoxybenzylsiloxane

In a 1-liter three-neck flask equipped with a stirrer, reflux condenser, and dropping funnel were placed 200 ml of water. A mixture of 85.6 g (0.364 mol) of p-methyldichloro-p-methoxybenzylsilane and 200 ml of ethyl ether was added dropwise with stirring from the dropping funnel over 4 hours at room temperature. After aging at room temperature for 1 hour, the organic compounds were extracted with diethyl ether and the extract was washed with water until the washings became neutral. The diethyl ether solution was dried with sodium sulfate and diethyl ether was distilled away. Distillation with calcium hydride gave 20.3 g (37.5 mmol) of the desired product in a yield of 31%.

The properties of the desired product were as follows:

Boiling point: 241° C./0.8 mmHg to 253° C./0.13 mmHg

NMR: (60 MHz, CCl$_4$, CH$_2$Cl$_2$, δ 5.33) δ 0.02, δ 0.03, δ 0.16 (9H, sx3), δ 1.96, 2.07 (6H, sx2), δ 3.79 (9H, s), δ 6.74 (CH, d, J=9 Hz), δ 6.98 (6H, d, J=9 Hz).

IR ($\nu$ cm$^{-1}$) 1620, 1520, 1470, 1305, 1260, 1220, 1185, 1090, 1030, 840, 815, 770.

(c) Synthesis of poly(methyl-p-methoxybenzylsiloxane)

In a 100-ml eggplant-shape flask containing a magentic bar were placed 9.0 g (17 mmol) of trimer of methyl-p-methoxybenzylsiloxane and 45 mg (0.5 wt%) of tetramethylammonium hydroxide. With the flask stoppered and immersed in an oil bath at 80° C., the reactants were stirred by a magnetic stirrer. The weight-average molecular weight reached 5,000 four minutes after the start of reaction. It reached 10,000 after 10 minutes, 14,000 after 20 minutes, 16,000 after 30 minutes, and 19,000 after 60 minutes. The desired product having a desired weight-average molecular weight can be obtained when the flask is removed from the oil bath and cooled with water after a certain period of reaction time. The content in the flask was used as such for the subsequent reaction.

The properties of the desired product were as follows:

NMR: (60 MHz, CCl$_4$, CH$_2$Cl$_2$, δ 5.33) δ 0.00 (3H, br. s), δ 1.94 (2H, br. s), δ 3.71, δ 3.80 (3H, sx2), δ 6.82 (4H, br. s).

IR ($\nu$ cm$^{-1}$) 2975, 2850, 1620, 1520, 1475, 1305, 1260, 1225, 1190, 1090, 1040, 845, 810, 775, 755.

(d) Synthesis of poly(methyl-p-methoxybenzylsiloxane-co-methyl-p-hydroxybenzylsiloxane)

Poly(methyl-p-methoxybenzylsiloxane) was placed in a flask, and flask was equipped with a reflux condenser and the atmosphere in the flask was replaced with nitrogen. 30 ml of chloroform was added to the flask to make a uniform solution of the polymer. A prescribed amount of trimethylsilyl iodide was added. After stirring at room temperature for 3 hours, 20 ml of methanol was added and stirring was continued for 2 hours. After the completion of the reaction, the low-boiling fractions were distilled away at room temperature under reduced pressure. The residues were extracted with tetrahydrofuran and diethyl ether. The extract was washed with an aqueous solution of sodium hydrogen sulfite, an aqueous solution of sodium hydrogen carbonate, and finally an aqueous solution of sodium chloride. The solvent was distilled away under reduced pressure. Thus there was obtained the desired product. Trimethylsilyl iodide in an amount of 1.5 equivalent for the methoxy group converted 100% of methoxy groups into hydroxyl groups. An amount of 1.3 equivalent resulted in a 90% conversion, 0.76 equivalent, 71%, 0.65 equivalent, 58%, and 0.47 equivalent, 41%.

The properties of the desired product were as follows:

Melting point: (polymer having a weight-average molecular weight of 10,000 and 80% converted hydroxyl groups) 53°–68° C.

NMR: (60 MHz, CD$_3$CSCD$_3$, CH$_2$Cl$_2$, δ 5.68) δ 0.07 (br. s, CH$_3$), δ 1.85 (br. s, —CH$_2$—), δ 4.00 (br. s, —OCH$_3$), δ 6.61 (br. s, ring proton), δ 8.81 (br. s, —OH).

IR (ν cm$^{-1}$) 3320, 1620, 1510, 1450, 1270, 1240, 1180, 1070, 840, 800.

(e) Solubility

Poly(methyl-p-methoxybenzylsiloxane-co-methyl-p-hydroxybenzylsiloxane) was examined for solubility toward commonly used organic solvents. It was found to be soluble in methanol, tetrahydrofuran, N,N-dimethylacetamide, 2-methylcyclohexanone, isoamyl acetate, methyl cellosolve, and dimethylsulfoxide, and also found to be insoluble n toluene, hexane, and carbon tetrachloride.

It was found to be soluble in aqueous solutions of tetramethyl ammonium hydroxide and potassium hydroxide.

(f) Resistance to oxygen plasmas

A 5 wt% solution of poly(methyl-p-methoxybenzylsiloxane-co-methyl-p-hydroxybenzylsiloxane) in 2-methylcyclohexanone was applied to a silicon substrate by spin coating method. A 0.2 μm thick polymer film was formed. The film was baked at 90° C. for 30 minutes. The baked film was exposed to oxygen plasmas (oxygen pressure: 0.5 Torr, degree of vacuum: 10$^{-4}$ Torr, RF: 300 W) for 10 minutes. The film did not waste at all.

EXAMPLE 2

Poly(1,1-dimethyl-2-p-methoxyphenylsilylmethylene-co-1,1-dimethyl-2-p-hydroxyphenylmethylene)

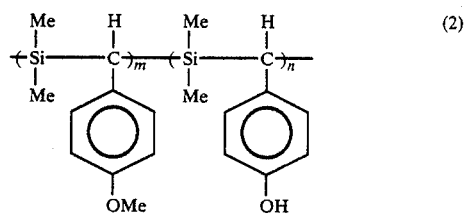

(a) Synthesis of chlorodimethyl-p-methoxybenzylsilane

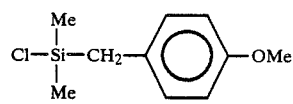

In a 2-liter three-neck flask equipped with a stirrer, reflux condenser, dropping funnel, and thermometer were placed 31.0 g (1.28 mol) of magnesium powder, 129 g (1 mol) of dimethyldichlorosilane, and 500 ml of diethyl ether. With the flask cooled below 10° C., a mixture of 100 g (0.639 mol) of p-methoxybenzyl chloride and 250 ml of diethyl ether was added dropwise from the dropping funnel over 4 hours. After aging at room temperature for 1 hour, excess magnesium and magnesium chloride were removed by suction filtration. The filtrate was distilled to give 87.8 g (0.409 mol) of the desired product in a 64.0% yield.

The properties of the desired product were as follows:

Boiling point: 80° C./1 mmHg

NMR: (60 MHz, CCl$_4$, CH$_2$Cl$_2$, δ 5.33) δ 0.46 (6H, s), δ 2.40 (2H, s), δ 3.83 (3H, s), δ 6.82 (2H, d, J=9.0 Hz), δ 7.08 (2H, d, J=9.0 Hz).

IR (ν cm$^{-1}$) 2970, 1620, 1520, 1475, 1310, 1260, 1195, 1090, 1055, 855, 825, 780.

(b) Synthesis of bromo-p-methoxyphenylchlorodimethylsilylmethane (dl)

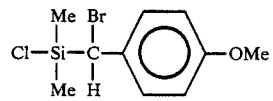

In a 500-ml three-neck flask equipped with a stirrer and reflux condenser were placed 43.2 g (0.200 mol) of chlorodimethyl-p-methoxybenzylsilane and 200 ml of carbon tetrachloride. With heating and stirring, 35.6 g (0.200 mol) of N-bromosuccinimide was added slowly. After aging for 1 hour, succinimide was removed by suction filtration and the filtrate was distilled to give 31.7 g (0.108 mol) of the desired product in a yield of 54.0%.

The properties of the desired product were as follows:

Boiling point: 113°–117° C./2.5 mmHg

Melting point: lower than 30° C.

NMR: (60 MHz, CCl₄, TMS) δ 0.50 (3H, s), δ 0.60 (3H, s), δ 3.73 (3H, s), δ 4.32 (1H, s), δ 6.73 (2H, d, J=9 Hz), δ 7.19 (2H, d, J=9 Hz).

IR ($\nu$ cm⁻¹) 1610, 1510, 1465, 1305, 1260, 1185, 1040, 865, 845, 820, 800.

(c) Synthesis of poly(1,1-dimethyl-2-p-methoxyphenylmethylene)

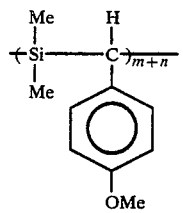

In a 500-ml three-neck flask equipped with a Helschberg stirrer, reflux condenser, and dropping funnel, with the atmosphere therein replaced with nitrogen, were placed 7.6 g (0.33 gram atom) of sodium and 120 ml of toluene. The contents were heated with stirring to give fine sodium particles. Under the refluxing of toluene with stirring, a mixture of 44.1 g (0.15 mol) of bromo-p-methoxyphenylchlorodimethylsilylmethane and 30 ml of toluene was added dropwise over 1 hour. After aging for 1 hour, the reaction product was poured into methanol to removed excess sodium and precipitate the polymer. After filtration, the polymer was dissolved in tetrahydrofuran and the resulting solution was added dropwise to water to remove the sodium salt. The filtered polymer was washed with methanol and dried under reduced pressure to give 10 g of the desired product in a yield of 37%.

The properties of the desired product were as follows:

Softening point: 121°-125° C.
Weight-average molecular weight: 3,400
NMR: (60MHz, C₆, D₆, CH₂Cl₂, δ 5.33) δ 1.27 (6H, br. s), δ 4.43 (3H, br. s), δ 7.4–8.7 (4H, br. s). (Methyl proton was not confirmed.)
IR ($\nu$ cm⁻¹) 2960, 2850, 1610, 1510, 1470, 1385, 1300, 1260, 1100, 1045, 860, 790.

The polymer formed through Grignard reaction had a weight-average molecular weight of about 1000.

(d) Synthesis of poly(1,1-dimethyl-2-p-methoxyphenylmethylene-co-1,1-dimethyl-2-p-hydroxyphenylsilmethylene)

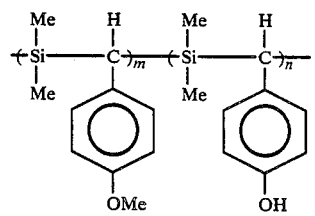

In a 25-eggplant-shape flask equipped with a reflux condenser were placed 0.50 g (2.8 mmol in terms of monomer units) of poly(1,1-dimethyl-2-p-methoxyphenylsilmethylene) having a weight-average molecular weight of 3,000, 1.5 ml of chloroform, and 0.88 g (4.4 mmol) of trimethylsilyl iodide. Reaction was carried out for 4 hours with stirring by a magnetic bar. 4 ml of methanol was added and stirring was continued for 3 hours. Low boiling fractions were distilled away under reduced pressure at room temperature, and the residues were extracted with ether. The ether solution was washed with an aqueous solution of sodium hydrogen sulfite, an aqueous solution of sodium hydrogen carbonate, and finally an aqueous solution of sodium chloride. Ether was distilled away under reduced pressure. The resulting polymer was reprecipitated from tetrahydrofuran/water. After thermodrying under reduced pressure, there was obtained 0.23 g of the desired product.

The properties of the desired product were as follows:

Weight-average molecular weight: 1,800
OH content: 100%
Softening point: 107°-113° C.
NMR: (60 MHz, DMSO-d₆, δ 5.68) δ 0.79–0.51 (6H, br. s), 6.15 –7.35 (4H, br. s). Methyl proton and hydroxy proton were not confirmed.
IR ($\nu$ cm⁻¹) 3380, 2980, 1510, 1270, 1100, 1040, 860, 810.

In the meantime, the OH content can be controlled by the amount of trimethylsilyl iodide or the reaction time. For example, 90% of methoxy groups is converted into hydroxyl groups where the reaction time is 4 hours and the amount of trimethylsilyl iodide is 1.3 equivalent for methoxy groups. 0.80 equivalent gave a conversion of 70%, 0.65 equivalent, 55%, and 0.50 equivalent, 40%.

The OH content was determined by performing the reaction in deuterochloroform. During the reaction, the conversion of methoxy groups into trimethylsiloxy groups was traced by means of NMR spectrometry.

(e) Solubility

Poly(1,1-dimethyl-2-p-methoxyphenylsilmethylene-co-1,1-dimethyl-2-p-hydroxyphenylsilmethylene) was examined for solubility toward commonly used organic solvents. The polymer containing more than 40% of hydroxyl groups was found to be soluble in methanol, tetrahydrofuran, N,N-dimethylacetamide, 2-methylcyclohexanone, isoamyl acetate, methyl cellosolve, and dimethylsulfoxide, and also found to be insoluble in toluene, hexane, and carbon tetrachloride.

It was found to be soluble in aqueous solutions of tetramethyl ammonium hydroxide and potassium hydroxide.

(f) Resistance to oxygen plasmas

A 10 wt% solution of poly(1,1-dimethyl-2-p-methoxyphenylsilmethylene-co-1,1-dimethyl-2-p-hydroxyphenylsilmethylene) in 2-methylcyclohexanone was applied to a silicon substrate by spin coating method. Upon baking at 100° C. for 30 minutes, a 0.2 μm thick polymer film was formed. The baked film was exposed to oxygen plasmas (oxygen pressure: 0.5 Torr, degree of vacuum: 10⁻⁴ Torr, RF: 300 W) for 10 minutes. The film did not waste at all.

EXAMPLE 3

Poly(hydroxybenzylsilsesquioxane-co-p-methoxybenzylsilsesquioxane)

(a) Synthesis of p-methoxybenzyltrichlorosilane

In a 2-liter three-neck flask equipped with a stirrer, reflux condenser, dropping funnel, and thermometer were placed 30 g (1.2 gram atom) of magnesium powder, 170 g (1.00 mol) of silicon tetrachloride, and 500 ml of diethyl ether. The flask was cooled below 10° C. A mixture of 100.0 g (0.639 mol) of p-methoxybenzyl chloride and 200 ml of diethyl ether was added dropwise with stirring for the dropping funnel over 4 hours. After aging at room temperature for 1 hour, excess magnesium and magnesium chloride were removed by suction filtration. The filtrate was distilled to give 44.0 g (0.172 mol) of the desired product in a yield of 26.9%.

The properties of the desired product were as follows:
Boiling point: 117.5°–119.5° C./3.0 mmHg
NMR: (60 MHz, CCl$_4$, CH$_2$Cl$_2$, δ 5.33) δ 2.91 (2H, s), δ 3.90 (3H, s), δ 6.91 (2H, d, J=8 Hz), δ 7.20 (2H, d, J=8 Hz).

(b) Synthesis of poly(p-methoxybenzylsilsesquioxane)

In a 100-ml three-neck flask equipped with a magnetic bar, dropping funnel, and reflux condenser were placed 11 g (0.13 mol) of sodium hydrogen carbonate and 40 ml of water. A mixture of 10.23 g (40.00 mmol) of p-methoxybenzyltrichlorosilane and 10 ml of diethyl ether was added dropwise from the dropping funnel over 30 minutes, followed by aging for 30 minutes. After the completion of the reaction, the reaction mixture was extracted with ether, and the extract was dried with sodium sulfate. Diethyl ether was distilled away under reduced pressure to give 5.10 g of hydrolyzate.

The properties of the hydrolyzate were as follows:
NMR: (60 MHz, CDCl$_3$, CH$_2$Cl$_2$, δ 5.33) δ 2.03 (2H, br. s), δ 3.80 (3H, br. s), δ 6.80 (4H, br. s).
IR ($\nu$ cm$^{-1}$) 3400, 2950, 2850, 1610, 1510, 1460, 1300, 1250, 1180, 1090, 1035, 890, 835, 790, 760.
Weight-average molecular weight: 2,000

In a 25-ml eggplant-shape flask were placed 4.80 g of the hydrolyzate obtained as mentioned above and 49 mg of 10 wt% solution of potassium hydroxide in methanol. The contents were heated at 200° C. for 2 hours. After the completion of the reaction, the reaction mixture was dissolved in benzene and the benzene solution was added dropwise to methanol to precipitate solids. The solids were filtered off and dried to give 4.00 g of poly(p-methoxybenzylsilsesquioxane).
NMR: (60 MHz, CDCl$_3$, CH$_2$Cl$_2$, δ 5.33) δ 1.19 (2H, br. s), δ 3.78 (3H, br. s), δ 6.73 (4H, br. s).
IR ($\nu$ cm$^{-1}$) 2950, 2850, 1615, 1515, 1465, 1305, 1250, 1195, 1120, 1040, 840, 800, 770.
Weight-average molecular weight: 3,300

(c) Synthesis of poly(hydroxybenzylsilsesquioxane-co-p-methoxybenzylsilsesquioxane)

In a 100-ml eggplant-shape flask equipped with a reflux condenser were placed 3.73 g (21.6 mmol in terms of MeOC$_6$H$_5$CH$_2$SiO$_{3/2}$), 20 ml of chloroform, and 6.92 g (34.6 mmol) of trimethylsilyl iodide. Reaction was carried out at 70° C. for 22 hours with stirring by a magnetic bar. 20 ml of methanol was added at room temperature and stirring was continued for 30 minutes. Low boiling fractions were distilled away under reduced pressure, and the residues were extracted with a mixed solvent of diethyl ether and tetrahydrofuran. The extract was washed with an aqueous solution of sodium hydrogen sulfite, an aqueous solution of sodium hydrogen carbonate, and finally an aqueous solution of sodium chloride. The solvent was distilled away under reduced pressure. The resulting polymer was reprecipitated from acetone/hexane. After thermodrying under reduced pressure, there was obtained 2.71 g of the desired product.

The properties of the desired product were as follows:
Weight-average molecular weight: 4,800
OH content: 85%
NMR: (60 MHz, DMSO-d$_6$, δ 5.68) δ 1.75 (2H, br. s), 3.63 (—OCH$_3$, br. s), 6.58 (4H, br. s), 8.88 (—OH, br. s).
IR ($\nu$ cm$^{-1}$) 3350, 1620, 1515, 1450, 1240, 1185, 1120, 1040, 840, 805, 760.

In the meantime, the OH content can be controlled by the amount of trimethylsilyl iodide or the reaction time. For example, where 1.6 equivalent of trimethylsilyl iodide was used, the reaction time of 4 hours brought about a 36% conversion of methoxy groups into hydroxyl groups, 7 hours, 54%, 12 hours, 75%, 48 hours, 95%, and 72 hours, almost 100%. The OH content was determined by performing the reaction in deuterochloroform. During the reaction, the conversion of methoxy groups into trimethylsiloxy groups was traced by means of NMR spectrometry.

(d) Solubility

Polymer of this invention was examined for solubility toward commonly used organic solvents. The polymer having more than 50% of hydroxyl groups were soluble in methanol, tetrahydrofuran, N,N-dimethylacetamide, 2-methylcyclohexanone, isoamyl acetate, ethyl cellosolve, and dimethylsulfoxide, and were insoluble in toluene, hexane, and carbon tetrachloride.

It was also soluble in an aqueous solution of tetramethyl ammonium hydroxide.

(e) Resistance to oxygen plasmas

An 8 wt% solution of the polymer of this invention in 2-methylcyclohexanone was applied to a silicon substrate by spin coating method. Upon baking at 100° C. for 30 minutes, there was obtained a 0.2 μm thick film. The baked film was exposed to oxygen plasmas (oxygen pressure: 0.5 Torr, RF: 300 W, barrel type asher) for 20 minutes. The film did not waste at all.

What is claimed is:

1. An alkali-soluble siloxane polymer in which more than 40% of the siloxane units is composed of the unit represented by the formula (1):

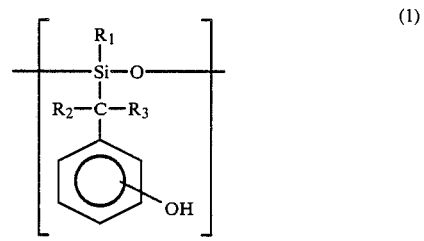

where R$_1$ is a hydrogen or a monovalent organic group other than aromatic groups; R$_2$ and R$_3$ are each a hydrogen, a chlorine, or a monovalent organic group.

2. An alkali-soluble siloxane polymer as set forth in claim 1, wherein R$_1$ is methyl group, R$_2$ and R$_3$ are each hydrogen, and the OH group is at the p-position of the benzene ring.

3. an alkali-soluble silmethylene polymer composed of the constitutional unit represented by the formula (2).

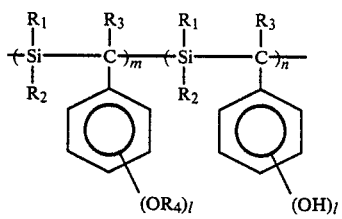

(2)

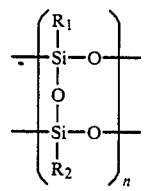

(3)

where $R_1$, $R_2$, and $R_3$ are each a hydrogen or a monovalent organic group; $R_4$ is an alkyl group; $l$ is 1 or 2; the OH groups and $OR_4$ groups are at arbitrary positions on the benzene ring, m and n are positive integers and $m+n$ is 2 to 200 and $n/(m+n)$ is greater than 0.4.

4. An alkali-soluble silmethylene polymer as set forth in claim 3, wherein $R_1$, $R_2$, and $R_4$ are methyl groups, $R_3$ is hydrogen, $l$ is 1, and the OH group and $OR_4$ group are each on the p-position of the benzene ring.

5. An alkali-soluble polyorganosilsesquioxane polymer represented by the formula (3):

where $R_1$ and $R_2$ are the same or different organic groups, and n is a positive integer representing a degree of polymerization, and more than 40% of $R_1$ and $R_2$ are hydroxybenzyl groups.

6. An alkali-soluble polyorganosilsesquioxane polymer as set forth in claim 5, wherein $R_1$ and $R_2$ are each p-hydroxybenzyl group and p-methoxybenzyl group, and n is 8 to 200.

7. An alkali-soluble polyorganosilsesquioxane polymer as set forth in claim 5, wherein $R_1$ and $R_2$ are each a p-hydroxybenzyl group, and n is 8 to 200.

* * * * *